United States Patent [19]
Johnston et al.

[11] Patent Number: 5,347,213
[45] Date of Patent: Sep. 13, 1994

[54] AIR CORE GAUGE METHOD AND APPARATUS WITH REDUCED POWER DISSIPATION

[75] Inventors: William J. Johnston, Flint; James W. Guest, Cadillac, both of Mich.; James D. Richardson, Kokomo, Ind.

[73] Assignee: Delco Electronics Corp., Kokmo, Ind.

[21] Appl. No.: 936,486

[22] Filed: Aug. 28, 1992

[51] Int. Cl.$^5$ .................. G01R 5/14; G01R 7/00; G01R 1/20; G01P 3/481
[52] U.S. Cl. .................. 324/143; 324/144; 324/166
[58] Field of Search ............ 324/143, 144, 146, 147, 324/166, 167

[56] References Cited

U.S. PATENT DOCUMENTS

| | | | |
|---|---|---|---|
| 4,291,268 | 9/1981 | Okuyama | 324/146 X |
| 4,383,444 | 5/1983 | Beaman et al. | 73/304 |
| 4,386,406 | 5/1983 | Igarashi et al. | 364/442 |
| 4,441,157 | 4/1984 | Gerchman et al. | 364/551 |
| 4,827,209 | 5/1989 | Tanaka et al. | 324/167 X |
| 4,841,238 | 6/1989 | Birch | 324/144 |
| 4,924,178 | 5/1990 | Miyajima | 324/143 X |

FOREIGN PATENT DOCUMENTS 282274 12/1987 Japan .................. 324/146

*Primary Examiner*—Gerard R. Strecker
*Attorney, Agent, or Firm*—Anthony L. Simon; Jimmy L. Funke

[57] ABSTRACT

An air core gauge method and apparatus are disclosed. The apparatus receives an input signal and comprises a gauge device and driver circuit for driving the gauge device. A detection circuit detects transitions in the input signal and provides a control output in response to detected transitions. A power control circuit, responsive to the control output, provides a 100% duty cycle power signal to the driver circuit during detected transitions and otherwise provides a power signal with a duty cycle less than 100% to the driver circuit so that the average power consumed by the gauge is reduced and the operating temperature of the gauge is reduced.

5 Claims, 3 Drawing Sheets

AIR CORE GAUGE METHOD AND APPARATUS WITH REDUCED POWER DISSIPATION

This invention relates to a gauge method and apparatus and more particularly a gauge method and apparatus suitable for use in a motor vehicle.

BACKGROUND OF THE INVENTION

Vehicle instrumentation displays typically use air core gauges to display information to vehicle operators. A typical air core gauge incorporates two or more coils mounted in proximity to a rotational rotor. In response to current applied to the coils, the coils create a magnetic field having a resultant vector. The magnetic field acts on the magnetic rotor, which rotates to align itself with the magnetic field. A pointer attached to a spindle of the gauge rotates along with the rotor to indicate a measure of a parameter to the vehicle operator.

In designing air core gauge systems, it is desirable to attain quick response of the gauge and minimization of the effect of forces resistant to the gauge rotation, such forces include viscous friction, shear forces of the silicon damping fluid, friction between the spindle and bobbin bearing, moment of inertia of the pointer and imbalance of the pointer. To minimize the effects of the resistant forces, power applied to the gauge is at a high enough level where these forces are minimal compared to the magnetic forces produced by the coils. This high level of power applied to the gauge is power that would be otherwise available to the vehicle. The high level of power applied to the gauge also causes heating the gauge due to power dissipation in the coils and requires heat sinking of the electronic devices used to drive the gauges due to their increased power handling requirements.

SUMMARY OF THE PRESENT INVENTION

This invention provides a gauge apparatus and method that effects quick responses in instrumentation gauges while, at the same time, reducing the power dissipated by the gauges. Advantageously, this invention provides a gauge apparatus with lower power requirements. Advantageously, this invention provides a gauge apparatus that reduces the average power required by the gauge apparatus. Advantageously, the method and apparatus of this invention provide gauges with reduced operating temperature.

This invention achieves the above-described performance characteristics and advantages by providing a method and apparatus that drive an air core gauge at full power during transitional periods so that, when the pointer is moved, it has a quick response and opposing forces in the gauge mechanism have a minimal affect. During steady state periods where the pointer of the gauge is maintained at a single position, power is reduced to the gauge to a level necessary to maintain the pointer position.

Structurally, the apparatus of this invention comprises a gauge device and means for detecting transitions in an input signal and for providing a control output in response to detected transitions. A means responsive to the control output drives the gauge device at full power during detected transitions and otherwise drives the gauge device at reduced power, whereby the gauge indicates a measure of a parameter represented by the input signal.

A more detailed description of this invention, along with various embodiments thereof, is set forth below.

DETAILED DESCRIPTION OF THE INVENTION

Figure 1:
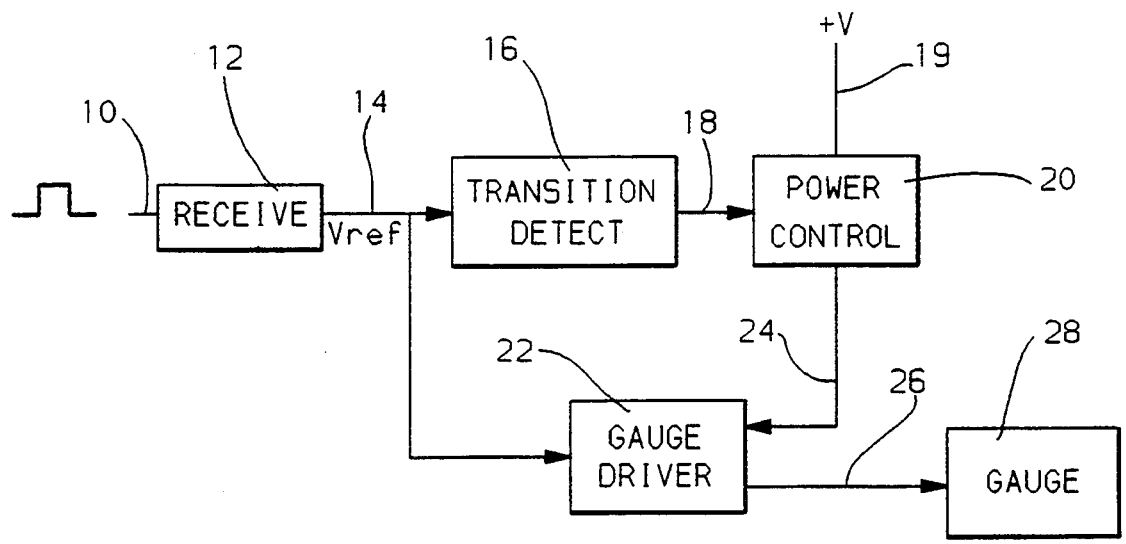
FIG. 1 is an illustration of the apparatus of this invention.

Referring to FIG. 1, the apparatus of this invention comprises receiving means 12, transition detection means 16, power control means 20, gauge driver means 22 and a gauge 28. The receiving means 12 receives a signal on line 10 indicative of a parameter and provides on line 14 an output signal in response to the received signal. The output signal on line 14 is referred to as the reference signal. The reference signal is provided to driver means 22 and to transition detection means 16, which detects changes in the reference signal and provides an output signal on line 18 indicative of the power control mode desired. Changes in the reference signal on line 14 indicate changes of the input signal on line 10. During detected changes in the reference signal, the output signal on line 18 indicates full power is required by the apparatus. When no change is detected in the reference signal, the output signal on line 18 indicates reduced power is required by the apparatus.

Driver means 22 receives power through line 24 from power control means 20, which is coupled to the voltage supply line 19. Power control means 20 is responsive to the signal on line 18 and provides full power to the driver means 22 during transitional periods of the reference signal (i.e. when changes in the reference signal are detected), while it provides reduced power to driver means 22 during steady state periods of the reference signal on line 14 (i.e., when no changes in the reference signal are detected).

Driver means 22 outputs signals on line 26 to gauge 28 driving gauge 28 in a manner to indicate the measure of the parameter indicated by the signal received on line 10. In response to the power provided by power control means 20, driver means 22 drives gauge 28 at full power during transitional periods of the reference signal and at reduced power during steady state periods of the reference signal (and input signal).

Figure 2:
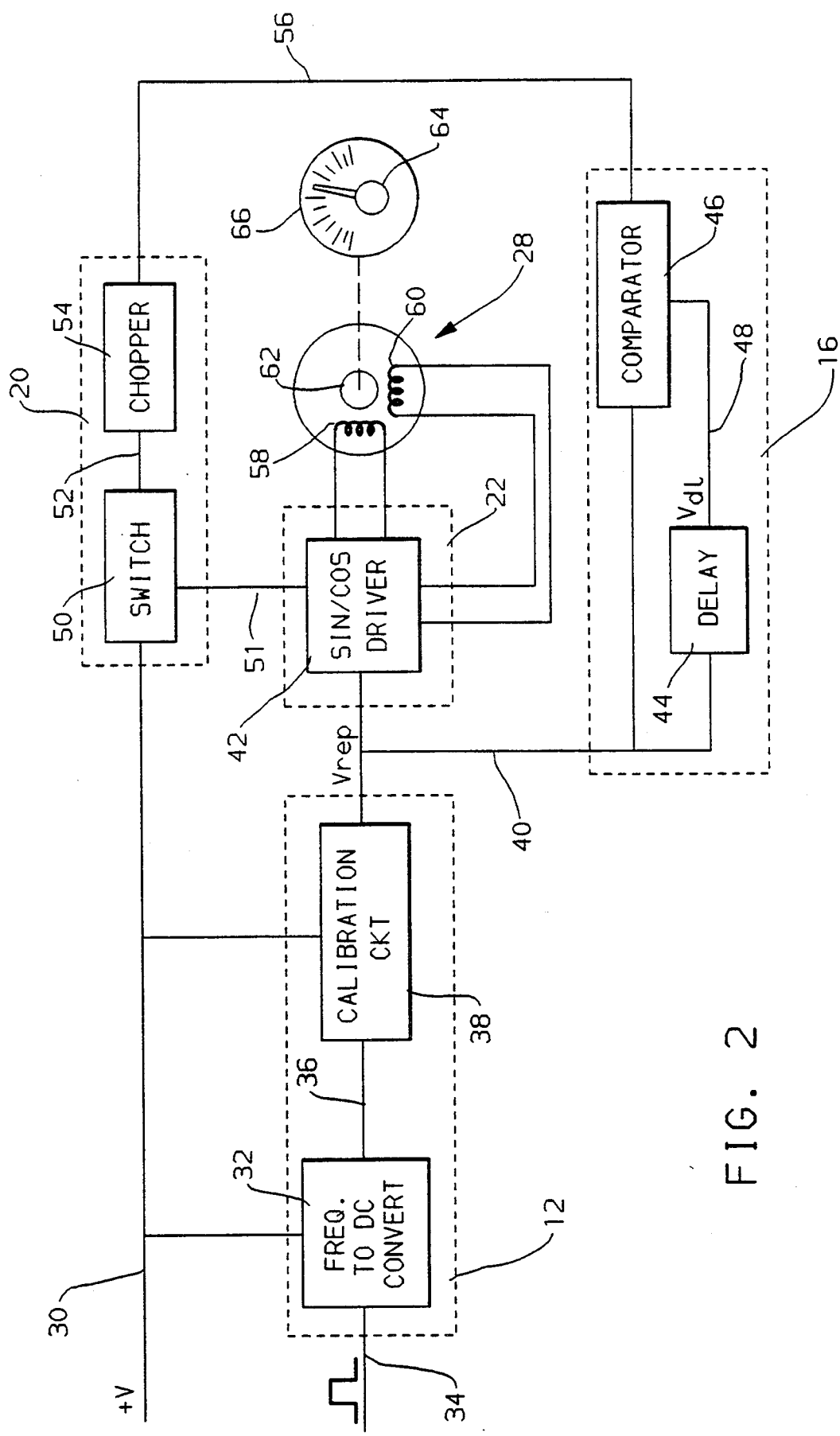
FIG. 2 is an example implementation of the apparatus of this invention.

Referring to FIG. 2, the receiving means 12 shown comprises frequency to DC converter 32 and calibration circuit 38 and driver means 22 comprises sin-cos driver 42. These circuits are well known to those skilled in the art and are often used in speedometer and/or tachometer systems.

In general, a frequency signal on line 34 comprises a train of pulses provided by a vehicle speed sensor or engine speed sensor. The frequency to DC converter 32 converts the frequency signal to a voltage signal on line 36. The voltage signal on line 36 is proportional to the frequency of the signal received on line 34. Calibration circuit 38 provides the reference signal on line 40 at a voltage level suitable for use by the sin-cos driver 42. If the output of the frequency to DC converter 32 is at a suitable level for use by sin-cos driver 42, calibration circuit 38 may be omitted.

In response to the signal on line 40, sin-cos driver 42 drives gauge 28, which as shown is a two coil air core gauge comprising coils 58 and 60 and rotor 62. Sin-cos driver 42 provides an output signal to coil 60 indicative of the cosine of the desired angle of rotation of rotor 62 and provides an output signal to coil 58 indicative of the sin of the desired angle of rotation of rotor 62. In response to the sin and cos signals, coils 58 and 60 produce a magnetic field that has a resultant direction equal to the angle of desired rotation. The rotor 62 responsively rotates to align itself with the direction of the magnetic field. Pointer 64 is attached to a spindle (not shown) and rotates in response to the rotation of rotor 62 to indicate the vehicle speed, engine speed, etc. along scale 66 in the vehicle instrument cluster.

The delay circuit 44, comparator 46, chopper circuit 54 and switch 50 represent improvements provided by this invention. The reference signal on line 40 is provided to the delay circuit 44 and the comparator 46. The delay circuit 44 provides an output on line 48, $V_{dl}$, which is a signal that is a time delay of the reference signal on line 40. Comparator 46 compares the signal on line 48 with the reference signal on line 40. If the two signals are substantially equal, which indicates that no transition is required of pointer 64, the output of comparator 46 is low. However, if the signals on lines 40 and 48 are substantially unequal, a desired transition of the gauge is indicated and the output of comparator 46 on line 56 is high.

The power control means 20 comprises switch 50 and chopper 54. Chopper 54, when receiving a low signal on line 56, provides a pulse signal on line 52 with a 25% duty cycle. Although a wide range of frequencies can be used for the pulse signal on line 52, a sub-audible frequency in the 10–100 Hz range is preferred. The 25% duty cycle pulse on line 52 controls switch 50, which responsively provides reduced power to sin-cos driver 42 by providing a 25% duty cycle power signal on line 51. Responsively, the coils 58 and 60 of the gauge 28 are driven at a reduced power level, which is 25% of the full power level. The reduced power to coils 58 and 60 maintains the resultant magnetic field acting on rotor 62 at the same angle and direction as when full power is applied, while reducing the strength of the field. The reduced strength field maintains the rotor and pointer at the desired position so that the pointer 64 does not stray.

When the input signal on line 34 changes, the reference voltage on line 40 also changes and the signals on lines 40 and 48 become substantially unequal. In response to the unequal signals on lines 40 and 48, the high output signal provided by comparator 46 controls chopper 54 to provide 100% duty cycle signal on line 52 to the switch 50. In response to the 100% duty cycle signal, full power is provided to the sin-cos driver 42 through line 51. With the full power provided to the sin-cos driver 42, coils 58 and 60 are driven at full power. As the angle of the magnetic field resulting from coils 58 and 60 changes in response to the changing signal on line 40, the full power provided to the coils 58 and 60 provides a high magnitude resultant magnetic field forcing a quick response by rotor 62 and pointer 64. When the input signal on line 34 stops changing and achieves a steady state, the reference signal on line 40 stops changing and, in response, the power provided by sin-cos driver 42 to gauge 28 is again reduced to the 25% power level.

The above described apparatus of this invention drives the gauge 28 at a reduced power during steady state situations and maintains the pointer at the proper position. This reduced power provided to the gauge 28 provides reduced power dissipation in the gauge 28 and reduced power flow through the sin-cos driver 42. The result is an overall power savings by the apparatus and a reduced resultant operating temperature of the coils 58 and 60 and sin-cos driver 42.

The theoretical operating temperature of gauge 28 is proportional to a square of the duty cycle of the signal driving the coils 58 and 60. If driven at a 25% duty cycle, the calculated temperature rise is merely 6.25% of the theoretical temperature rise of 100% duty cycle of the same signal driving the same gauge. Experimental results show that in a standard gauge driven at 100% duty cycle, a 9.3° C. temperature rise above room ambience was observed. By reducing the power to a 25% duty cycle in steady state conditions, the temperature rise was reduced 0.6° C., a 93% reduction and fairly close to the theoretical prediction. During transitional periods, full power is re-applied to the gauge providing quick response in overcoming mechanical opposing forces in the gauge.

The delay circuit 44 described above may comprise a simple RC delay circuit of a type well known to those skilled in the art. Comparator circuit 46 is easily implemented by those skilled in the art to perform the functions described herein. Chopper circuit 54 comprises sine wave signal generator providing a sine wave signal to one input of differential amplifier with the other input of amplifier receiving the output of comparator circuit 46. When comparator circuit 46 output is low, the output of the differential amplifier is a 25% duty cycle pulse and when the output of comparator circuit 46 is high, the output of the differential amplifier is a steady high signal (with a 100% duty cycle).

Switch 50 may comprise a power transistor that provides power on line 51 in response to the output of chopper 54. When the output of comparator 46 is high, line 51 carries a full power 100% duty cycle signal. When the output of comparator 46 is low, line 51 carries a reduced power signal, e.g., at a 25% duty cycle.

Figure 3A:
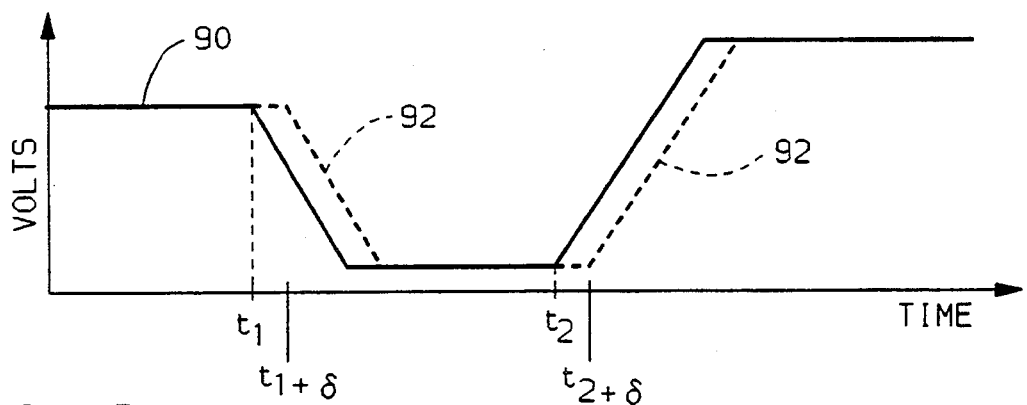
FIG. 3a and 3b illustrate the operation of this invention.
Figure 3B:
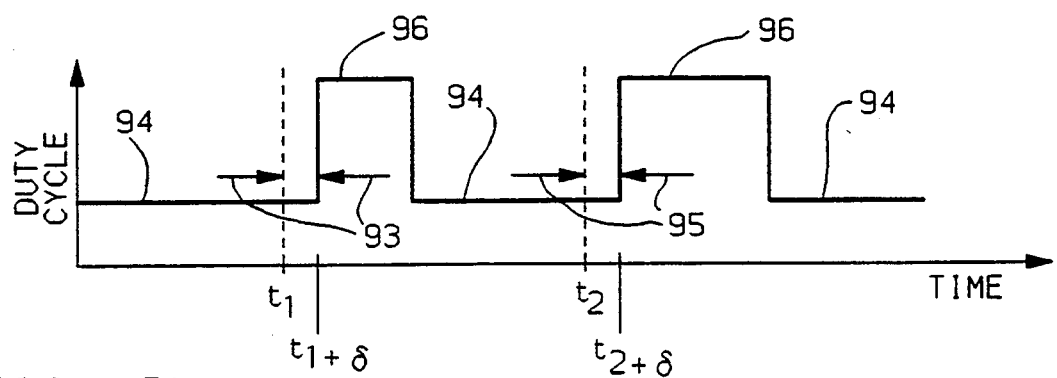

Referring to FIG. 3a, line 90 in the graph represents an example reference signal on line 40 and dotted line 92 representing the delayed signal on line 48. With reference to FIG. 3b line segments 94 represent use of a 25% duty cycle power signal to drive gauge 28 and line segments 96 represent use of a 100% duty cycle power signal to drive gauge 28. As can be seen, the 100% duty cycle drive occurs only during the transitional periods when line 92 deviates from line 90 in FIG. 3a indicating a changing parameter signal. Arrows 93 and 95 shown in FIG. 3b illustrate a dead band, or hysteresis, provided by the comparator 46 to provide stability during steady state situations.

Figure 4:
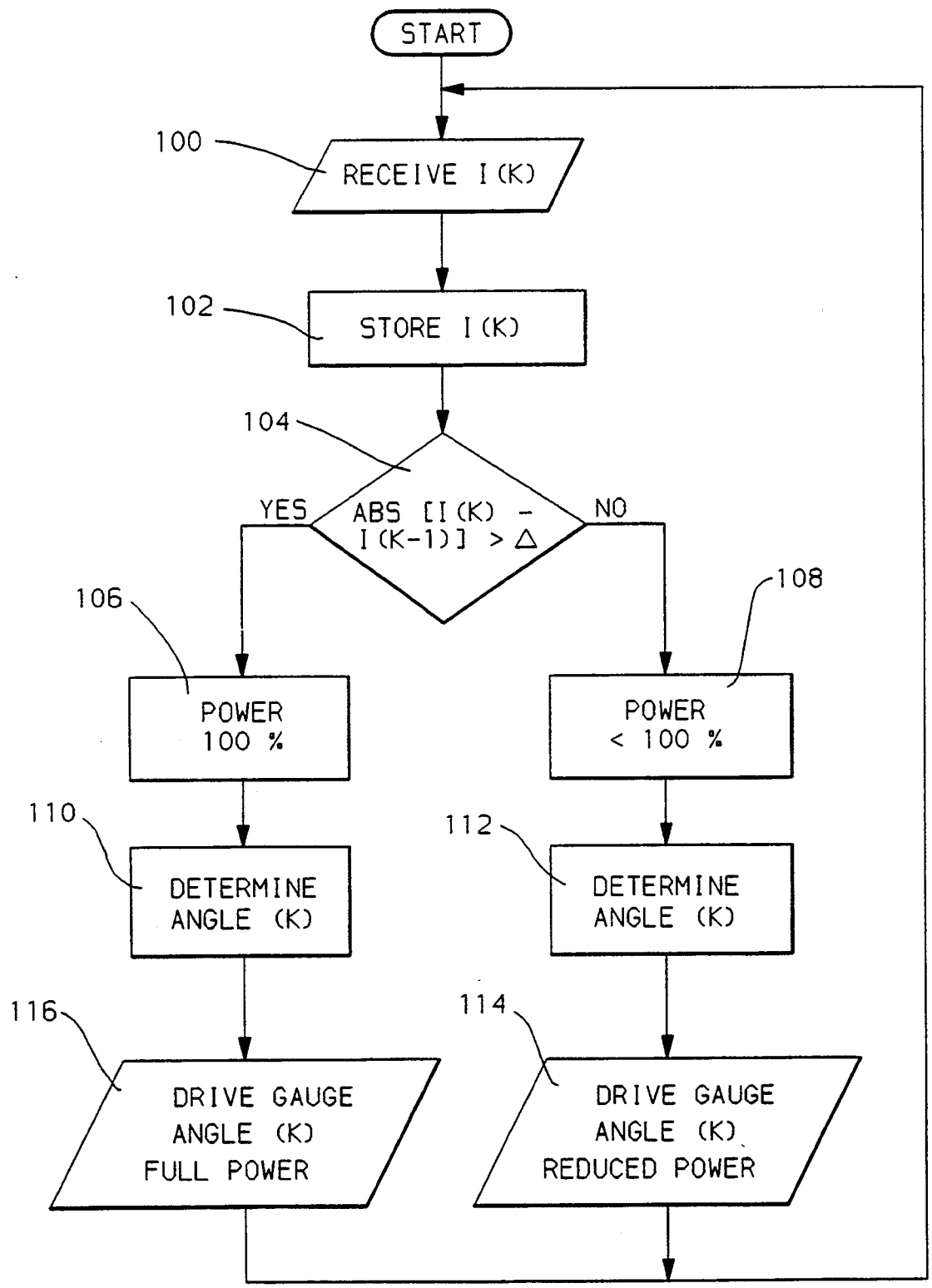
FIG. 4 illustrates the method of this invention.

FIG. 4 illustrates an example flow diagram of the method of this invention and can be implemented in microprocessor controlled gauge systems. At step 100, the method receives an input signal indicative of a parameter to be displayed. At step 102 the input signal is temporarily stored, as in a memory or a temporary delay circuit as shown in FIGS. 2 and 3. At step 104, present input signal is compared to the previously stored input signal and if the present input signal is substantially the same as the previously stored input signal, then at steps 108, 112 and 114, the gauge is driven at a reduced power level to maintain the angular position of the pointer. If at step 104 the present input signal is different from the previously stored input signal, then steps 106, 110 and 116 drive the gauge at the desired angle at full power.

More specifically, for a microprocessor implementation, at step 104, the present input signal, I(k), is compared to the previously stored input signal, I(k−1), with the function:

$$ABS(I(k)-I(k-1)) > \Delta, \tag{1}$$

where ABS indicates the absolute value function and $\Delta$ sets the hysteresis level. An example dead band or hysteresis level corresponds to one degree of pointer deflection. The dead band prevents the circuit from switching to high power mode when little or no pointer movement would otherwise occur. If the above function (1) is true, then blocks 100, 112 and 114 are executed. If the above function (1) is not true, then blocks 106, 110 and 116 are executed.

Step 108 sets a power level command indicating reduced power, for example, the 25% power level described above. Step 112 sets the angle command equal to the angle command for the previous time period, and step 114 outputs the set angle command to drive the gauge at the set angle and at the reduced power level.

At step 106, the power level command is set to 100% power and the gauge angle command is determined at step 110. At step 116, the output command drives the gauge at the desired angle at full power.

The above described implementations of this invention are example implementations. The duty cycle of 25% for the reduced power mode is the preferred implementation but other duty cycles may be preferred, depending upon system constraints. For example, if more or less power is required to maintain pointer position, a greater or lesser duty cycle for low power mode may be implemented.

Various other improvements and modifications to this invention may occur to those skilled in the art. Such modifications include substituting alternative circuitry for the circuitry described to implement the apparatus and/or method of this invention. A microprocessor implementation of this invention can be easily accomplished by those skilled in the arts in view of the above described apparatus and method. Any modifications and improvements which occur to those skilled in the art will fall within the scope of this invention as set forth by the claims below.

The embodiments of the invention in which an exclusive property or privilege is claimed are defined as follows:

1. An apparatus to which an input signal is coupled, the input signal being indicative of a measure of a parameter, the apparatus comprising:
   a gauge device for indicating the measure of the parameter;
   means for detecting transitions in the input signal and for providing a control signal in response to detected transitions;
   means, responsive to the input signal and the control signal, for providing an output signal for driving the gauge device to indicate the measure of the parameter, the output signal having a first power level during detected transitions in the input signal and for otherwise having a second power level, where the first power level is greater than the second power level.

2. A method of operating a gauge device to indicate a measure of a parameter comprising the steps of receiving an input signal indicative of the measure of the parameter, comparing the received input signal with a previous input signal, if the received input signal is substantially equal to the previous input signal then driving the gauge apparatus to indicate the measure of the parameter with a drive signal having a first power level, and if the received input signal is not substantially equal to the previous input signal then driving the gauge apparatus to indicate the measure of the parameter with the drive signal having a second power level, wherein the first power level is less than the second power level.

3. The method set forth in claim 2 wherein the step of driving the gauge apparatus at the reduced power level comprises providing a modulated signal with a duty cycle less than 100% to the gauge apparatus.

4. The apparatus set forth in claim 2 wherein the duty cycle is 25%.

5. An apparatus to which a parameter signal indicative of a measure of a parameter is coupled, comprising:
   a delay circuit comprising means for receiving the parameter signal and providing a delayed signal in response thereto;
   a comparison circuit, coupled to the delay circuit and also receiving the parameter signal, comprising means for comparing the delayed signal to the parameter signal and for providing a comparison result signal characterized by a first signal condition if the delayed signal equals the parameter signal and a second condition if the delayed signal is different from the parameter signal;
   a chopper circuit, coupled to the comparison circuit, comprising means for receiving the comparison result signal and for providing a chopper output signal responsive thereto, the chopper output signal having a first duty cycle if the comparison result signal is characterized by the first signal condition and the chopper output signal having a second duty cycle if the comparison result is characterized by the second signal condition, the second duty cycle being greater than the first duty cycle; and
   means responsive to the parameter signal and the chopper output signal for providing a drive signal to drive a gauge to indicate the measure of the parameter, the drive signal having a first power level when the chopper output signal has the first duty cycle and having a second power level when the chopper output signal has the second duty cycle, the second power level being greater than the first power level.

* * * * *